(12) United States Patent  
Sugawara et al.

(10) Patent No.: US 6,232,137 B1  
(45) Date of Patent: May 15, 2001

(54) SEMICONDUCTOR LIGHT EMITTING ELEMENT AND ITS MANUFACTURING METHOD

(75) Inventors: Hideto Sugawara, Kawasaki; Masayuki Ishikawa, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/089,624

(22) Filed: Jun. 3, 1998

(30) Foreign Application Priority Data

Jun. 4, 1997 (JP) .................................... 9-146263

(51) Int. Cl.$^7$ .................................... H01L 21/00
(52) U.S. Cl. ................ 438/46; 438/47; 438/681
(58) Field of Search ................ 438/22, 46, 47, 438/681

(56) References Cited

U.S. PATENT DOCUMENTS

| | | | |
|---|---|---|---|
| 5,734,182 | * 3/1998 | Nakamura et al. | 257/96 |
| 5,777,350 | * 7/1998 | Nakamura et al. | 257/96 |
| 5,805,624 | * 9/1998 | Yang et al. | 372/45 |
| 5,981,977 | * 11/1999 | Furukawa et al. | 257/94 |

FOREIGN PATENT DOCUMENTS

| | | | |
|---|---|---|---|
| 8125223 | 5/1996 | (JP) | H01L/33/00 |
| 8-330627 | 12/1996 | (JP) | H01L/33/00 |

* cited by examiner

Primary Examiner—Long Pham  
(74) Attorney, Agent, or Firm—Hogan & Hartson, LLP

(57) ABSTRACT

When a plurality of semiconductor layers including a nitride compound layer containing indium are stacked on a substrate, materials of layers above the indium containing nitride compound layer are limited to specific compounds, or their growth temperatures are limited within a predetermined range, to suppress thermal deterioration of the nitride compound layer containing indium or deterioration of the interface and to thereby grow a high-quality semiconductor light emitting element using nitride compound semiconductors. When manufacturing a nitride compound semiconductor light emitting element having a first layer made of a first nitride compound semiconductor containing indium and a second layer stacked on the first layer, conditions for stacking the second layer are selected those inside a closed region defined by connecting points plotted at x and y coordinates (364, 600), (364, 1010), (550, 1010), (650, 600) and (364, 600) on a graph taking emission wavelengths based on band-to-band transition of the first layer in nanometer on the x axis and taking growth temperatures of the second layer in ° C. on the y axis. Thus, a high-performance light emitting element can be made without inviting thermal deterioration of the first layer.

15 Claims, 5 Drawing Sheets

SEMICONDUCTOR LIGHT EMITTING ELEMENT AND ITS MANUFACTURING METHOD

BACKGROUND OF THE INVENTION

This invention relates to a semiconductor light emitting element and its manufacturing method. More particularly, the invention relates to a semiconductor light emitting element and its manufacturing method preventing thermal deterioration of nitride compound layer containing indium and deterioration of interfaces, and thereby promising growth of a high-quality nitride compound semiconductor light emitting element, by restricting materials of layers overlying the nitride compound layer containing indium to specific materials or by restricting growth temperatures within a predetermined range upon stacking a plurality of semiconductor layers involving the nitride compound layer containing indium on a substrate.

Most of nitride compound semiconductors are optically direct-transitional and capable for highly efficient radiative recombination. Their bandgap energy widely ranges from 1.89 to 6.2 eV. For these favorable natures, development is under progress for using them as high-efficient light emitting elements, such as various kinds of short-wavelength semiconductor lasers and high-luminous visible LEDs.

In the present application, the term "nitride compound" pertains to any compound semiconductor which can be expressed by the chemical formula $B_xIn_yAl_zGa_{1-x-y-z}N$ ($0 \leq x < 1, 0 \leq y \leq 1, 0 \leq z \leq 1, x+y+z \leq 1$) with any values of the mole fractions x, y and z in their respective ranges. For example, InAlN (x=0, y=0.4, z=0.6) is also regarded as one of nitride compound semiconductors.

Nitride compound semiconductors can be expressed as combinations of gallium nitride, aluminum nitride, indium nitride and boron nitride which are binary semiconductors. Among them, gallium nitride (GaN) has been a subject of active developments. Gallium nitride has a melting point as high as 1700° C., the equilibrium vapor pressure of nitrogen under a growth temperature is very high. Therefore, it is difficult to grow gallium nitride in bulk single crystal, and its crystalline growth mainly relies on hydride chemical vapor deposition (HCVD) or metal organic chemical vapor deposition (MOCVD). Among them, crystal growth technique by MOCVD has been most actively developed, and has succeeded in growing ternary mixed crystals, such as gallium indium nitride (GaInN) made by adding indium to gallium nitride, gallium aluminum nitride (GaAlN) made by adding aluminum to gallium nitride, and indium aluminum nitride (InAlN) made by adding aluminum to indium nitride.

By utilizing a heterojunction of these materials, light emitting efficiency can be improved. When using a double hetero structure effective for confinement of injected carriers or light, highly luminous LED or short-wavelength semiconductor lasers can be realized.

As to gallium indium nitride which is a ternary mixed crystal, its band gap energy can be changed from 3.4 eV of gallium nitride (GaN) to 1.89 eV of indium nitride (InN) by changing the mole fraction of indium, and it can be used as active layers of light emitting elements over wide visible wavelength bands.

Gallium indium nitride can be made by combining gallium nitride and indium nitride. However, gallium nitride needs a growth temperature of 1000° C. or more to ensure an acceptable crystallographic quality whereas indium nitride must be grown under a lower temperature because of a high vapor pressure of indium.

These growth temperatures are taught in greater detail, for example, in Appl. Phys. Lett., 59, (1991) p2251. As taught there, the growth temperature for crystalline growth of gallium indium nitride containing a relatively higher rate of indium must be lower than that of gallium nitride.

As to the growth temperature of gallium aluminum nitride, there is a teaching in Appl. Phys. Lett., 64, (1994) p1535. As taught there, a temperature as high as that for gallium nitride is preferable for the epitaxial growth of gallium aluminum nitride.

As reviewed above, the optimum temperature is different for individual compound semiconductors. Therefore, in order to grow a double-heterostructure sandwiching an active layer made of gallium indium nitride between cladding layers made of gallium nitride or gallium aluminum nitride, for example, the growth temperature must be changed at the interfaces.

However, if the layers are grown in this mode, indium having a high vapor pressure evaporates from the surface of the gallium indium nitride layer already grown, when the temperature is raised after the growth of the gallium indium nitride active layer. It results in deteriorating the crystallinity of the gallium indium nitride layer and its interfaces with the cladding layers, and hence results in deterioration of operative characteristics of the device.

It would be a possible approach for preventing evaporation of indium to decrease the composition ratio of indium. However, composition of indium is an essential factor which determines band gaps and other basic properties, and any change in its value may invite undesirable changes in essential characteristics such as emission wavelength.

SUMMARY OF THE INVENTION

It is therefore an object of the invention to provide a semiconductor light emitting element and its manufacturing method permitting a hetero structure to be made without degrading the crystalline quality of nitride compound layer containing indium, such as gallium indium nitride, having a predetermined composition ratio of indium.

According to the invention, there is provided a method for manufacturing a semiconductor light emitting element having a first layer of a first nitride compound semiconductor containing indium and a second layer stacked on the first layer, comprising the step of:

stacking the second layer under conditions inside the closed region defined by connecting points plotted at x and y coordinates (364, 600), (364, 1010), (550, 1010), and (650, 600) on a graph taking emission wavelengths based on band-to-band transition of said first layer in nanometer on the x axis and taking growth temperatures of said second layer in ° C. on the y axis. In this manner, a high-performance light emitting element can be made without inviting thermal deterioration of the first layer.

When using MOCVD for stacking the layers and stacking a cap layer made of a nitride compound semiconductor having a low mole fraction of indium to cap the first layer, a layer above the cap layer can be stacked under conditions outside the closed region on the graph without inviting thermal deterioration of the first layer.

The first layer may be made of gallium indium nitride, and the cap layer may be made of gallium aluminum nitride, and the layer above the cap layer may be made of nitride compound.

The first layer and the second layer preferably have thicknesses not exceeding critical thicknesses in terms of generation of crystallographic defects caused by lattice mismatching, and the gallium indium nitride stacked as the first nitride compound semiconductor may have a mole fraction within the miscibility gap under an operation of a distortion energy by lattice mismatching.

According to the invention, there is further provided a semiconductor light emitting element including a substrate and a multi-layered structure of nitride compound semiconductors stacked on the substrate, wherein the multi-layered structure includes at least a first layer of gallium indium nitride, a second layer of gallium aluminum nitride stacked on said first layer, and a third layer of gallium nitride stacked on said second layer, the first and second layers having thicknesses not exceeding critical thicknesses in terms of generation of crystallographic defects caused by lattice mismatching, and the gallium indium nitride forming the first layer having a mole fraction within its miscibility gap.

According to the invention, there is also provided a semiconductor light emitting element having a substrate and a multi-layered structure of gallium nitride compound semiconductors stacked on the substrate, wherein the multi-layered structure includes at least an active layer of gallium indium nitride, and a cladding layer of gallium indium nitride stacked on the active layer, the active layer having a mole fraction of indium higher than that in the cladding layer. In this manner, thermal deterioration of the active layer is suppressed, and the contact resistance of the electrode can be reduced.

Even when the cladding layer contains an acceptor impurity, inactivation of the acceptor impurity is less liable to occur.

The cladding layer may include two layers which are different in composition to improve the emission efficiency and the contact characteristics of the electrode.

The cladding layer overlying the active layer can be stacked at a higher temperature than the stacking temperature of the active layer during growth of the light emitting element to ensure growth of a higher-quality crystal.

The invention is used practically in the above-summarized modes, and attains various effects shown below.

Since conditions in the optimum range are used for growing layers overlying the gallium indium nitride layer after growth thereof, the multi-layered structure including the gallium indium nitride layer can be made with a high crystalline quality minimizing thermal deterioration of the gallium indium nitride layer.

As a result, various characteristics of the semiconductor light emitting element using gallium nitride compound semiconductors, including its emission efficiency, can be improved and stabilized.

In the present invention, the cap layer is grown on the gallium indium nitride layer under conditions selected to prevent thermal deterioration. Therefore, even when the temperature is raised thereafter, no thermal deterioration occurs in the gallium indium nitride layer. As a result, all of the layers of the multi-layered structure of gallium nitride compound semiconductors have high crystallographic properties.

The invention can prevent thermal deterioration of the gallium indium nitride layer more effectively by advantageously utilizing mis-fit distortion caused by a difference in lattice constant.

By more positively utilizing mis-fit distortion caused by a difference in lattice constant, the invention can grow mixed crystals with mole fractions in the miscibility gap, which have been difficult to grow heretofore. Therefore, the range of application of nitride compound semiconductors can be expanded remarkably.

The invention can prevent thermal deterioration of the active layer in the nitride compound semiconductor light emitting element, and can make interfaces satisfying both steepness and smoothness by using gallium indium nitride as the material of the p-type cladding/contact layer. It also contributes to reducing the contact resistance with the electrode, and attains epoch-making improvements of light emitting efficiency and other various characteristics of semiconductor light emitting elements.

Additionally, inactivation of acceptors is less liable to occur. Therefore, active acceptors can be obtained without the need for specific processing such as electron beam irradiation or annealing. It results in simplifying the manufacturing process of light emitting elements, improving the yield and productivity of semiconductor elements.

Thus, the invention makes it possible to produce nitride compound semiconductors or light emitting elements with a high performance and a high reliability in a simple process with a high yield, and its industrial merits are great.

DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DETAILED DESCRIPTION OF THE PREFERRED EMBODIMENTS

Explained below are embodiments of the invention with reference to the drawings.

Figure 1:
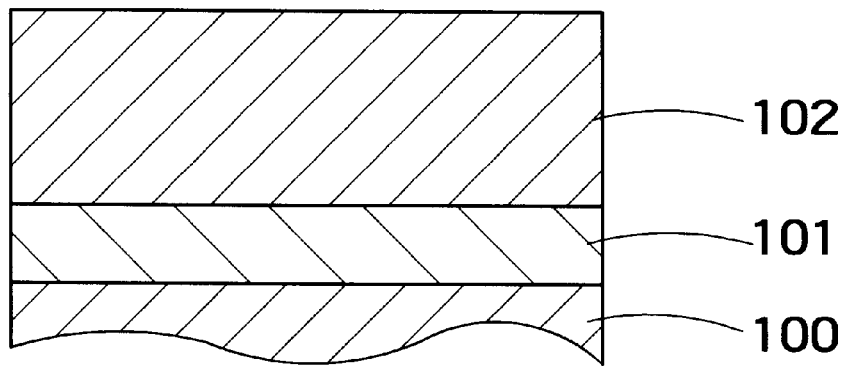
FIG. 1 is a schematic cross-sectional view of a multi-layered structure in a nitride compound semiconductor light emitting element taken as a first embodiment of the invention.

FIG. 1 is a fragmentary, schematic cross-sectional view of a multi-layered structure in a nitride compound semiconductor light emitting element according to the first embodiment of the invention. Here is shown a part of the multi-layered structure formed on a substrate, not shown. That is, a gallium indium nitride layer 101 and a gallium nitride layer 102 are stacked in this order on a gallium nitride layer 100. Although the gallium nitride layer 100 is used as the base layer of the gallium indium nitride layer 101 in FIG. 1, it may be replaced with a layer of any other appropriate nitride compound semiconductor.

The multi-layered structure shown in FIG. 1 can be grown by MOCVD, for example. Source material gases may be selected from trimethylgallium or triethylgallium, for example, as the source of gallium, from trimethylindium or triethylindium, for example, as the source of indium, and from ammonia or hydrazine, for example, as the source of nitrogen. These source material gases are supplied together with a carrier gas onto a heated substrate to thermally decompose them and to grow desired semiconductor crystals on the substrate. As the carrier gas, hydrogen is widely used. However, gases other than hydrogen, such as nitrogen or argon, are favorably used as the carrier gas, because hydrogen inactivates the p-type dopants in the nitride compounds.

To grow the multi-layered structure shown in FIG. 1, after the gallium nitride layer 100 is grown, the gallium source, indium source and nitrogen source are supplied together with a carrier gas to grow the gallium indium nitride layer 101. Thereafter, the gallium source and the nitrogen source are supplied together with a carrier gas to grow the gallium nitride layer 102.

The Inventors actually prepared samples of the multi-layered structure shown in FIG. 1 under various growth temperatures, and evaluated wafers thus made.

Figure 2:
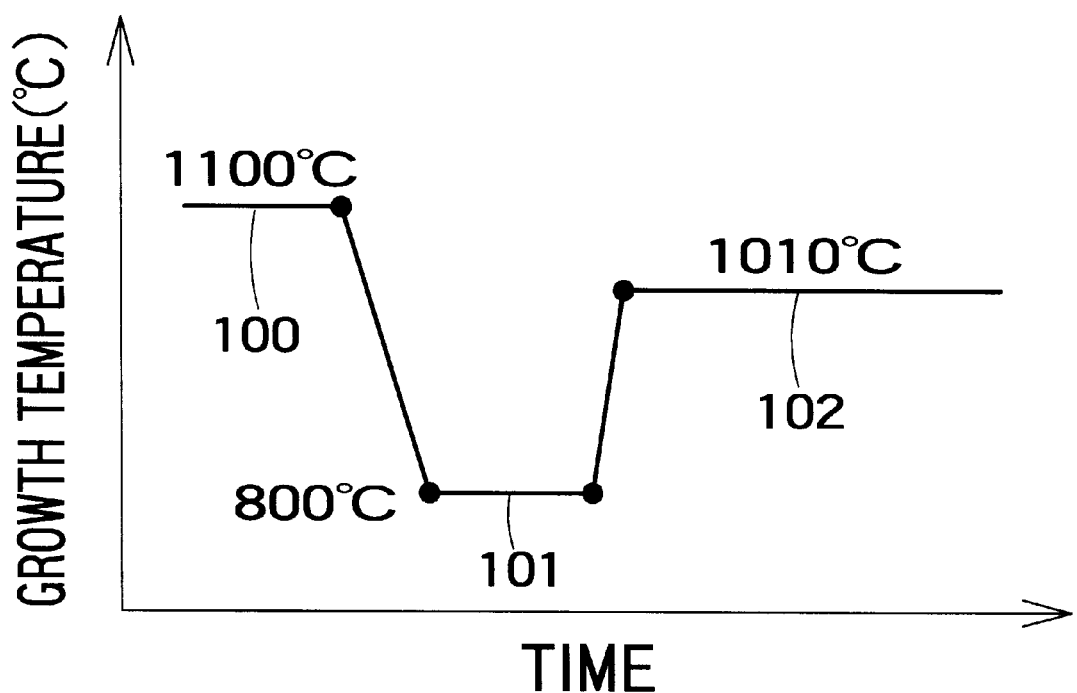
FIG. 2 is a diagram of a profile of appropriate growth temperatures for growing the structure shown in FIG. 1.

FIG. 2 shows one example of the profile of growth temperatures then used. Temperatures of respective layers were 1100° C. for the gallium nitride layer 100, 800° C. for the gallium indium nitride layer 101, and 1010° C. for the gallium nitride layer 102. In the process of growth of crystals under different growth temperatures, after growth of the gallium indium layer 101, the temperature was raised from 800° C. to 1010° C. while continuously supplying the carrier gas and the nitrogen source, and the gallium source is subsequently supplied to grow the gallium nitride layer 102.

The emission wavelength of the gallium indium nitride layer 101, namely $Ga_{1-x}In_xN$, depends upon the mole fraction x of indium. The mole fraction x of indium is determined by growth conditions, such as the ratio in supply amount of the indium source and the gallium source, growth temperature, growth rate, kind of the carrier gas, among others.

The Inventors confirmed through an experiment that the mole fraction of indium in the gallium indium nitride layer 101 grown under the temperature profile shown in FIG. 2 be 0.25 and the emission wavelength at the room temperature be 440 nm. It was also confirmed, through comparison thereof in various characteristics with a single-layered gallium indium nitride layer prepared for the comparison purpose, that the gallium indium nitride layer 101 used in the present invention had equivalent characteristics in terms of rocking curve reviewed by X-ray diffraction, and equivalent emission spectrum, emission intensity and emission wavelength reviewed by photoluminescence (PL) evaluation. That is, the temperature profile shown in FIG. 2 was confirmed not to change characteristics of the gallium indium nitride layer 101 even after the growth of the gallium nitride layer 102 thereon.

In contrast, when the growth temperature of the gallium overlying nitride layer was set to 1020° C. while maintaining the other conditions unchanged, the surface of the wafer after growth got colored in pale gray. It could be a result of thermal decomposition of the gallium indium nitride layer 101 upon increasing the temperature to 1020° C. for the growth of the overlying gallium nitride layer 102 after the growth of the gallium indium nitride layer 102. It was confirmed through PL evaluation of the thermally decomposed gallium indium nitride layer 101 that the emission intensity decreased to approximately 1/10 as compared with that of the structure having the overlying layer grown at 1010° C.

In case of another sample having the overlying gallium nitride layer 102 grown at 1030° C., the wafer after growth got colored in black, the gallium indium nitride layer 101 was seriously deteriorated, and no emission was observed in PL evaluation. When the overlying gallium nitride layer 102 was grown maintaining the temperature at the growth temperature of the gallium indium nitride layer 101, the gallium indium nitride layer 101 had satisfactory characteristics, but the overlying gallium nitride layer 102 exhibited a frosty surface morphology. Probably, it was caused by the growth temperature much lower than the optimum temperature for gallium nitride.

The Inventors made further experimental growth of multi-layered structures under various conditions, and found that, in order to grow the overlying layer without inviting deterioration in characteristics of the gallium indium nitride layer 101, the growth temperature for the overlying layer should be limited within a range.

Figure 3:
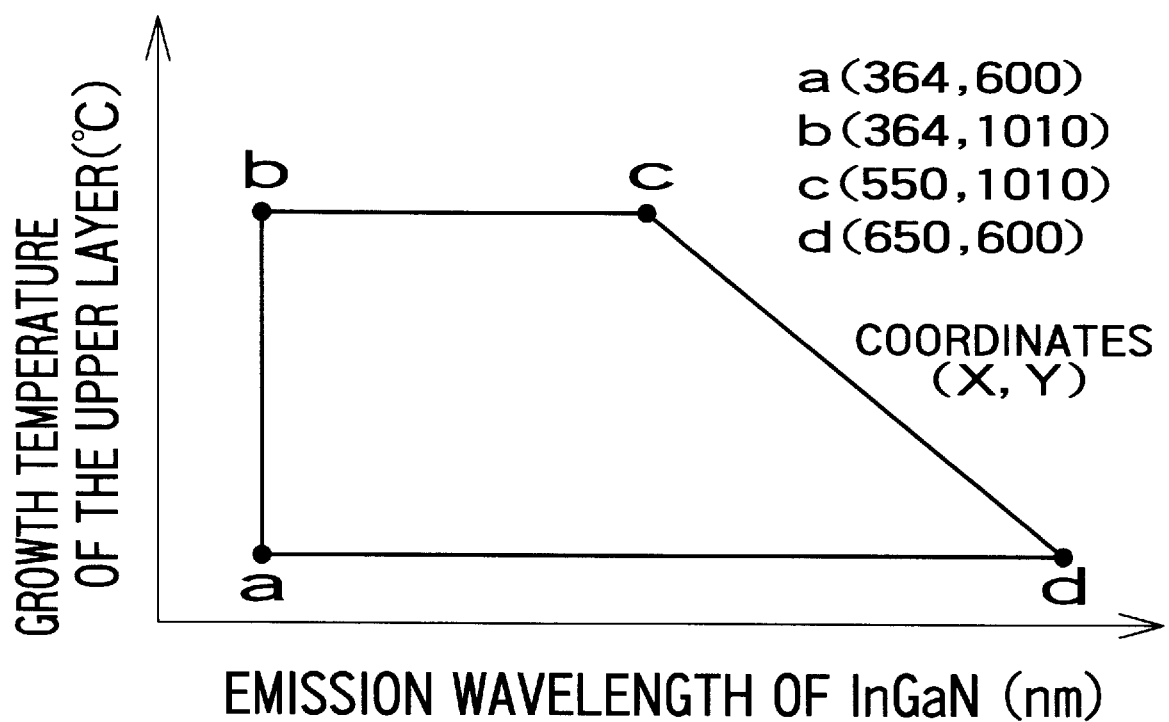
FIG. 3 is a diagram showing the optimum range of growth conditions of the structure shown in FIG. 1.

FIG. 3 is a diagram showing the range of optimum growth conditions, taking the emission wavelength of the gallium indium nitride layer 101 on the abscissa and the growth temperature of the overlying crystal layer 102 on the ordinate. The emission wavelength on the abscissa is based on band-to-band transition and changes with the mole fraction of indium. Therefore, FIG. 3 may be expressed similarly by replacing the abscissa with the mole fraction of indium.

In FIG. 3, the interior region defined by lines connecting points a, b, c and d is the optimum range of growth conditions. By growing the overlying layer under conditions within the range, characteristics of the gallium indium nitride layer can be maintained unchanged. Coordinates of point a is (364, 600) which conditions the emission wavelength of the gallium indium nitride layer 101 as 364 nm and the growth temperature of the overlying layer 102 as 600° C. Similarly, the other points are: b(364, 1010), c(550, 1010), and d(650, 600).

It is known from FIG. 3 that the optimum growth conditions depend upon the emission wavelength of the gallium indium nitride layer 101, i.e. the mole fraction of indium. That is, when the emission wavelength is in the range of 364 to 550 nm, the growth temperature of the overlying layer must be set between 600° C. and 1010° C. When the emission wavelength is in the range from 550 nm to 600 nm, the upper limit of the growth temperature gradually decreases as the emission wavelength becomes longer. It is probably because the mole fraction of indium increases as the emission wavelength becomes longer, and thermal decomposition is more likely to occur in the gallium indium nitride layer 101.

The reason why the lower limit of the optimum growth temperature range is set to 600° C. lies in that the lower acceptable limit of the temperature for the usual crystal growth is believed approximately 600° C. Therefore, if a special method ensuring crystal growth with a good crystallinity even under 600° C., the lower limit of the optimum temperature range shown in FIG. 3 can be shifted below 600° C. For example, if a microwave assisted MOCVD is employed, growth temperature may be lowered even below 600° C. because the decomposition of the source materials such as ammonia is enhanced by microwave excitation.

In the case where the layer overlying the gallium indium nitride layer 101 is made of gallium nitride or gallium aluminum nitride which needs a higher growth temperature, conditions with a higher temperature are preferably selected within the optimum range shown in FIG. 3. For example, if the emission wavelength of the gallium indium nitride layer 101 is in the range from 364 to 550 nm, the growth temperature of the overlying layer can be raised to 1010° C. maximum. When using MOCVD, the overlying gallium nitride layer can be grown with a high quality without inviting deterioration of the gallium indium nitride layer by setting the growth temperature of the overlying layer to 1010° C.

Next explained is the second embodiment of the invention.

Figure 4:
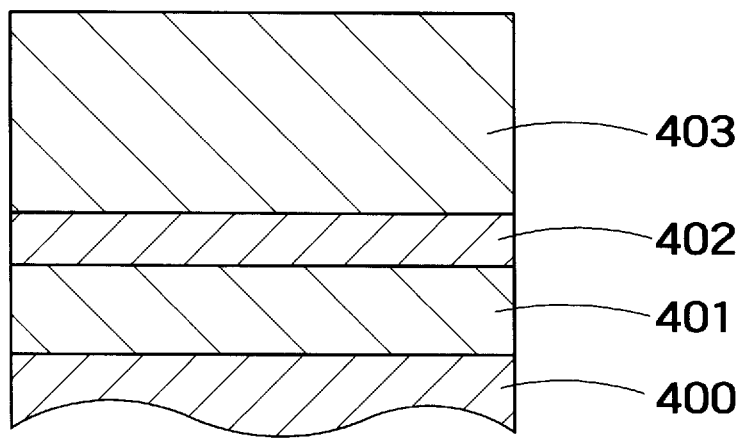
FIG. 4 is a schematic cross-sectional view of a multi-layered structure of nitride compound semiconductors taken as a second embodiment of the invention.

FIG. 4 is a schematic cross-sectional view of a multi-layered structure of nitride compound semiconductors according to the second embodiment of the invention. Here again, the multi-layered structure is formed on a substrate, not shown, and the multi-layered structure includes a gallium indium nitride layer 401 and overlying gallium nitride layers 402 and 403. The structure shown here is different from the first embodiment in changing the growth conditions during growth of the overlying layers 402 and 403 not only to prevent deterioration of the gallium indium nitride layer 401 but also to maintain the crystallinity of the overlying layers.

Figure 5:
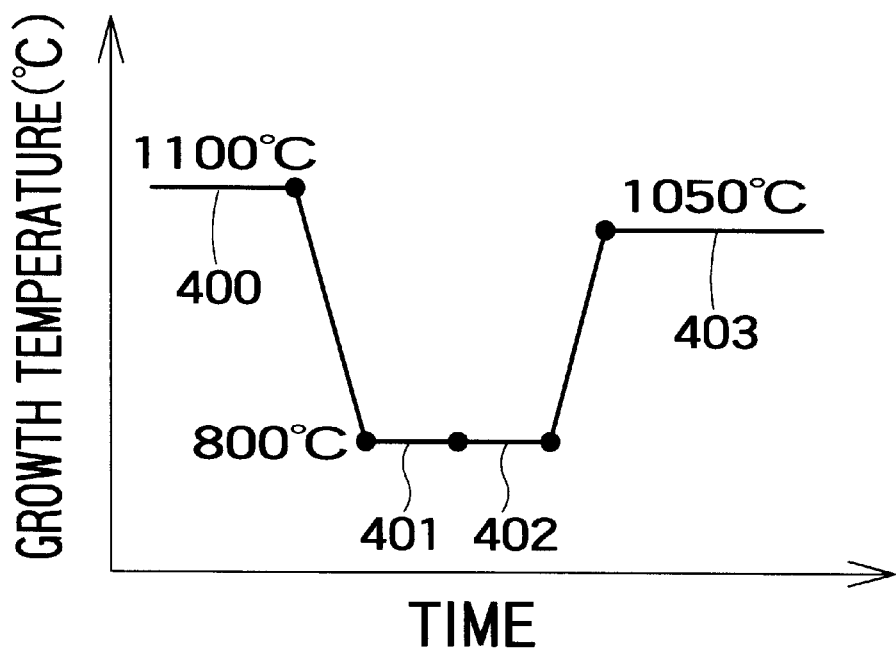
FIG. 5 is a diagram of a profile of appropriate growth temperatures for growing the structure shown in FIG. 4.

FIG. 5 shows a profile of appropriate growth temperatures for growing the structure shown in FIG. 4. After growing a gallium nitride layer 400 at 1100° C., the gallium indium nitride layer 401 is grown at 800° C. Maintaining the same temperature, the gallium nitride layer 402, relatively thinner, is next grown. Then, the temperature is raised to 1050° C., and the gallium nitride layer 403 is grown.

That is, the gallium indium nitride layer 401 is capped with the gallium nitride layer 402 without changing the growth temperature before increasing the growth temperature for stacking the gallium nitride layer 403. Therefore, a high-quality gallium nitride layer 403 can be stacked without deteriorating the gallium indium nitride layer 401. A gallium indium nitride layer 401 actually grown by the Inventors under the conditions shown in FIG. 5 had a PL luminous intensity equivalent to the luminous intensity of a single-layered gallium indium layer prepared for the comparison purpose, and was therefor confirmed to have a good crystalline quality.

The profile shown in FIG. 5 has been determined as maintaining the temperature used for growing the gallium indium nitride layer 401 also for growing the gallium nitride layer 402. However, as explained with the first embodiment, any temperature within the range shown in FIG. 3 leads to a favorable result. If the cap layer is made of gallium nitride, it is rather preferable to select a highest growth temperature within the range of FIG. 3 to ensure a high crystalline quality of the cap layer.

When the overlying layer 402 behaving as the cap layer is too thin, it cannot protect the gallium indium nitride layer 401 sufficiently. If it is too thick, various troubles occur when its crystallographic property is not so high. The Inventors confirmed through their experiments that, when using gallium nitride used as the cap layer, its thickness preferably be in the range from 1 nm to 100 nm, approximately.

Next explained is the third embodiment of the invention.

Figure 6:
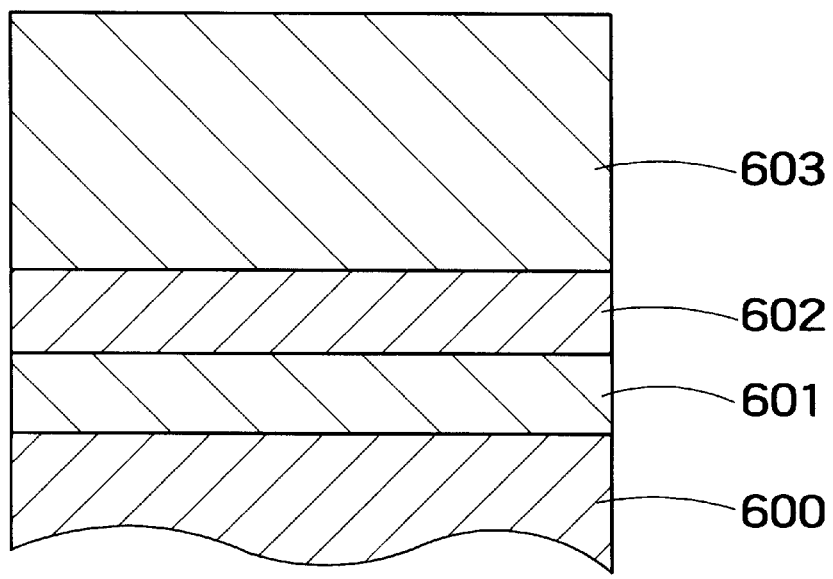
FIG. 6 is a schematic cross-sectional view of a multi-layered structure of nitride compound semiconductors taken as a third embodiment of the invention.

FIG. 6 is a schematic cross-sectional view of a multi-layered structure of nitride compound semiconductors according to the third embodiment of the invention. Here again, the multi-layered structure is formed on a substrate, not shown. The multi-layered structure includes a gallium indium nitride layer 601, gallium aluminum nitride layer 602 and gallium nitride layer 603 which are stacked in this order. The structure shown here is different from the second embodiment in that the gallium nitride compound semiconductor layer 602 containing aluminum is used as the cap layer of the gallium indium nitride layer 601.

Figure 7:
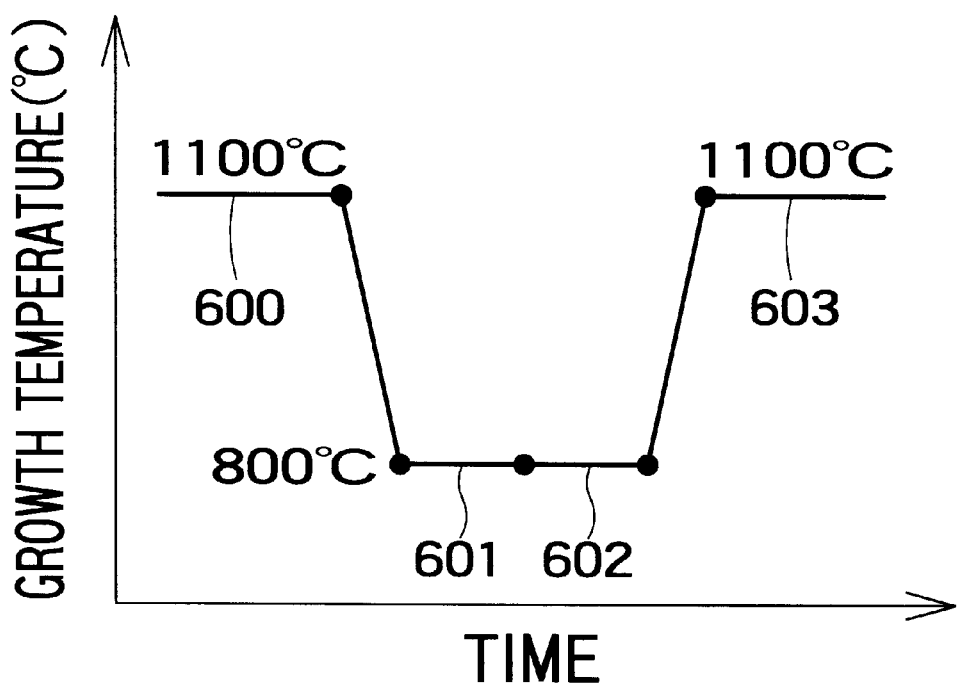
FIG. 7 is a diagram showing a profile of appropriate growth temperatures for growing the structure shown in FIG. 6.

FIG. 7 shows a profile of appropriate growth temperatures for growing the structure shown in FIG. 6. After growing the gallium nitride layer 600 at 1100° C., the gallium indium nitride layer 601 is grown at 800° C. Maintaining the temperature, the gallium aluminum nitride layer 602, relatively thin, is grown, and the temperature is thereafter raised to 1100° C. to grow the gallium nitride layer 603.

An advantage of the embodiment shown here lies in gallium aluminum nitride used as the cap layer 602 being less thermally decomposable and more thermally stable than gallium nitride. A possible reason thereof lies in a larger combining energy of aluminum than that of gallium. Therefore, a higher growth temperature can be used for growing the overlying gallium nitride layer 603, and it results in stably producing multi-layered structures excellent in crystallographic property and surface morphology.

Additionally, since gallium aluminum nitride used as the cap layer 602 has a lattice constant different from that of the lattice constant of the allium indium nitride layer 601, it is also effective in causing a misfit distortion in the surface layer and thereby suppressing thermal decomposition of the gallium indium nitride layer 601.

In the embodiment shown here, the ratio of aluminum in the gallium aluminum nitride layer 602 and the thickness thereof are preferably selected appropriately to prevent cracks caused by lattice mismatch. The Inventors experimentally stacked a gallium aluminum nitride layer 602 containing aluminum by 10% and having the thickness of 100 nm, and reviewed the emission characteristics of the gallium indium nitride layer 601. As a result, satisfactory characteristics equivalent to those of a crystal grown as a single layer were confirmed. In the temperature profile shown in FIG. 7, the growth temperature of the gallium aluminum nitride layer 602 is 800° C., which is the same as the growth temperature of the gallium indium nitride layer 601. However, as explained with reference to the first embodiment, the growth temperature of the gallium aluminum nitride layer 602 may be set higher within the range shown in FIG. 3 to obtain a favorable result.

Next explained is the fourth embodiment of the invention.

Figure 8:
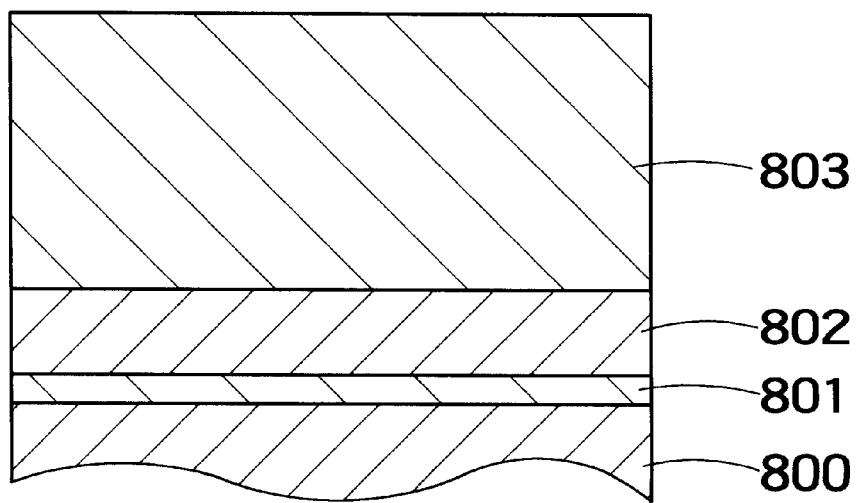
FIG. 8 is schematic cross-sectional view of a multi-layered structure of nitride compound semiconductors taken as a fourth embodiment of the invention.

FIG. 8 is a schematic cross-sectional view of a multi-layered structure of nitride compound semiconductors according to the fourth embodiment of the invention. Here again, the multi-layered structure is formed on a substrate, not shown, and a gallium indium nitride layer 801, gallium aluminum nitride layer 802 thereon, and gallium nitride layer 803 are stacked in this order as a part of the multi-layered structure.

A difference of the structure shown here from the third embodiment lies in adjusting mole fractions and thicknesses of the gallium indium nitride layer 801 and the gallium aluminum nitride cap layer 802 to further improve the emission characteristics of the gallium indium nitride layer 801. In general, as to the gallium indium nitride layer 801 and the gallium aluminum nitride layer 802 grown on a gallium nitride layer 800, when the mole fraction of the mixed crystal, i.e. the mole fraction of indium or the mole fraction of aluminum, is increased, their lattice mismatch with the gallium nitride layer 800 becomes larger, and crystal defects are produced accordingly. Therefore, the thicknesses of these layers are preferably below critical thicknesses not causing such crystal defects. Especially for the gallium indium nitride layer 801, which is often used as a light emitting layer, it is important to select appropriate conditions.

Figure 9:
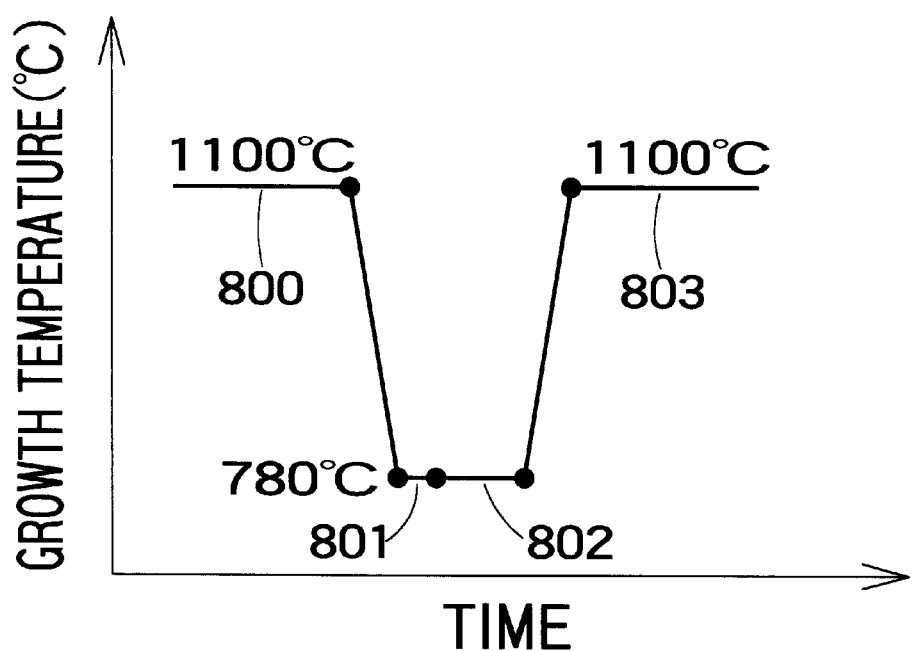
FIG. 9 is a diagram of a profile of appropriate temperatures for growing the multi-layered structure shown in FIG. 8.

FIG. 9 shows a profile of appropriate temperatures for growing the multi-layered structure shown in FIG. 8. After growing the gallium nitride layer 800 at 1100° C., the temperature is decreased to 780° C. to grow the gallium indium nitride layer 801 and the gallium aluminum nitride layer 802. After that, the temperature is raised to 1100° C. to grow the gallium nitride layer 803. The mole fraction x of indium in the gallium indium nitride layer, i.e. $Ga_{1-x}In_xN$ layer, 801, was 0.4, and the thickness was 20 nm. The mole fraction y of aluminum in the gallium aluminum nitride layer, i.e. $Ga_{1-y}Al_yN$ layer, 802, was 0.1, and the thickness was 100 nm.

With the multi-layered structure prepared in this manner, its cross-section was observed through a transmission electronic microscope. As a result, no defect caused by lattice mismatch was found in any interface of the gallium indium nitride layer 801 and the gallium aluminum nitride layer 802. That is, it was confirmed that these thicknesses of the layers did not exceed the critical thicknesses causing defects. The PL emission wavelength at the room temperature was 525 nm.

In any gallium indium nitride compound, there is a non-mixing composition range, called miscibility gap, where uniformly mixed crystal relative to the composition of indium cannot be obtained. The minimum mole fraction x of indium of the miscibility gap is about 0.2. This is taught, for example, by I-hsiu Ho, et al., Appl. Phys. Lett., 69(1996) p.2701. However, as a result of estimation of the mole fraction x of indium, based on the emission wavelength obtained by the embodiment and taking the quantum level and lattice distortion into account, the mole fraction x was confirmed to be not less than 0.4 which is the the range of the miscibility gap. That is, the embodiment shown here was confirmed to make a uniform crystal with a composition ratio heretofore believed to fall in the miscibility gap. This means that the range of the miscibility gap has been diminished. It is probably because the growth of the multi-layered structure under the critical thicknesses resulted in producing a distortion caused by lattice mismatch in the crystal, and the distortion energy changed the bonding energy of atoms in the crystal and reduced the miscibility gap.

As reviewed above, the present invention enables growth of a mixed crystal having a composition within the miscibility gap, i.e. the mole fraction of indium being not less than 0.2, which has been impossible heretofore, and enables epoch-making wide application of nitride compound semiconductors.

In the temperature profile shown in FIG. 9, the growth temperature of the gallium aluminum nitride layer 802 is 780° C., the same as the growth temperature of the gallium indium nitride layer 801. However, as explained with reference to the first embodiment, the growth temperature of the gallium aluminum nitride layer 802 may be higher within the range shown in FIG. 3 to obtain a favorable result.

The invention is not limited to specific examples shown above. For example, even when any of various semiconductor materials, such as arsenic gallium nitride layer and phosphorus gallium nitride layer, is used in lieu of the gallium nitride layer as the layer stacked on the gallium indium nitride layer, the invention is applicable in substantially the same manner. Also when stacking an oxide film or a metal film requiring an increase in temperature, the invention is applicable in substantially the same manner. In addition to these, the invention can be brought into practical use wich changes and modifications in various respects without departing from the spirit and concept of the invention.

Next explained is the fifth embodiment of the invention.

Figure 10:
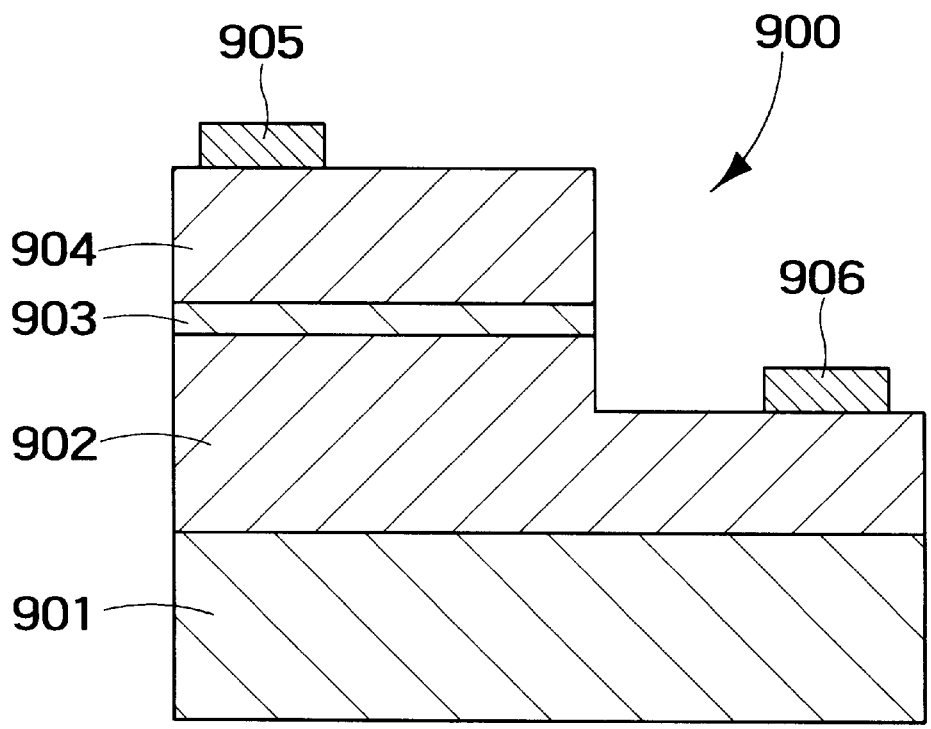
FIG. 10 is a schematic cross-sectional view of a multi-layered structure of nitride compound semiconductors taken as a fifth embodiment of the invention.

FIG. 10 is a schematic cross-sectional view of a multi-layered structure of nitride compound semiconductors according to the fifth embodiment. The multi-layered structure shown here is a surface emitting light emitting element. The light emitting element 900 is stacked on a sapphire substrate 901, selecting thicknesses of layers and growth temperatures as shown below.

Cladding/contact layer 902: 4000 nm, 1050° C.

Active layer 903: 100 nm, 800° C.

Cladding/contact layer 904: 500 nm, 1000° C.

The layer 902 is made of n-type gallium nitride, the layer 903 of undoped nitride compound containing indium, and 904 of p-type gallium indium nitride. Electrodes 905 and 906 for injection of a current are formed in contact with the layers 904 and 902, respectively.

A single layer of gallium indium nitride or aluminum indium nitride can be employed as the active layer 903. Alternatively, a multiple-quantum well (MQW) structure can be also employed as the active layer 903. One example of such a MQW structure is a combination of gallium indium nitride well layers and aluminum indium nitride barrier layers. Another example of such a MQW structure is a combination of indium nitride well layers and aluminum indium nitride barrier layers.

One of the features of the structure shown in FIG. 10 from a conventional structure lies in stacking the p-type gallium indium nitride layer 904 on the nitride compound active layer 903 containing indium. In a conventional element, a gallium nitride layer or a gallium aluminum nitride layer was stacked as a cladding layer on the nitride compound active layer 903. However, the conventional structure required to change a gas to another at the interface because the active layer and the cladding layer had to be grown at different temperatures and because the different carrier gases are used to supply source materials onto the substrate.

The need for different carrier gases is explained in Jpn. J. Appl. Phys. 31. (1992) L1457, for example. For growth of gallium indium nitride, an inert gas such as nitrogen must be used as a main carrier gas to promote introduction of indium into the crystal. For such reasons, it has been necessary to change both the growth temperature and the carrier gas after growth of the active layer.

The present invention, however, need not change the growth temperature and the carrier gas because the gallium indium nitride layer 904 is stacked on the active layer 903. Therefore, the interface between the active layer 903 and the contact/cladding layer 904 is quickly made, and is excellent in both steepness and smoothness. It results in remarkable improvements in emission characteristics and other various characteristics of light emitting elements.

The Inventors confirmed through experiments that either gallium nitride or gallium aluminum nitride grown by using nitrogen as the carrier gas exhibited a frosty surface morphology and had a degraded crystalline quality unacceptable for use in a light emitting element. In contrast, gallium indium nitride had an excellent surface morphology and a high crystallographic quality.

The light emitting element according to the embodiment of the invention is configured to take out light emitted in the active layer 903 through the gallium indium nitride cladding layer 904. Therefore, the band gap of the cladding layer 904 must be larger than the band gap of the active layer 903 to increase the transmittance of the cladding layer 904. For this purpose, the mole fraction of indium in the cladding layer 903 must be smaller.

There is a certain relation between the mole fraction and the growth conditions. The mole fraction of indium tends to decrease as the growth temperature rises, and tends to increase as the growth rate becomes high. Therefore, by setting the growth rate higher, a crystal with a lower mole fraction of indium can be grown at a higher growth temperature.

Thus, the present invention uses a higher growth rate and a higher temperature as growth conditions of the cladding layer 904, and realizes an excellent crystalline quality of the cladding layer 904. In this case, by setting the growth temperature of the cladding layer 904 at 1000° C. as explained before, a sufficiently good result is ensured. Therefore, the cladding layer 904 does not need a higher growth temperature as used for growing gallium nitride or gallium aluminum nitride, and does not invite thermal deterioration of the active layer 903.

Moreover, the present invention can activate acceptors without the need for special processing. It is widely known that magnesium and zinc used as acceptors of nitride compound semiconductors grown by MOCVD are inactivated by hydrogen atoms contained in carrier gases or source material gases. To re-activate such magnesium or other acceptors once inactivated, grown crystals need additional processing such as electron beam irradiation or annealing. This is taught, for example, by H. Amano, et al., Jpn., J. Appl. Phys., 28(1989) L2112, or by S. Nakamura, et al., Jpn. J. Appl. Phys., 31(1992) p.1258.

However, additional processing, such as electron beam irradiation or annealing, complicates the manufacturing process of light emitting elements. Especially, electron beam irradiation needs expensive installment which inevitably increases the production cost.

The present invention, however, can use nitrogen gas as the carrier gas for growth of a crystal containing magnesium or other acceptors, and can reduce inactivation of acceptors by hydrogen. Therefore, the invention needs no additional processing for activating acceptors.

The invention is also effective in realizing variety of the emission wavelength and stable structure, because the present invention enables growth of a mixed crystal having a composition within the miscibility gap which has been impossible heretofore as explained in the fourth embodiment of the invention. Especially, the light emitting elements comprising an active layer 903 having a MQW structure with indium aluminum nitride layers are advantageously realized according to the invention.

The invention is also effective in reducing the contact resistance between p-type semiconductor and electrode. A contact layer of p-type gallium nitride used in a conventional element has a large band gap. Therefore, the energy gap between the electron level of a normally used p-side electrode made of gold or gold/zinc and the valence band is large, and also the contact resistance is high. In contrast, the present invention successfully reduces the energy gap and the contact resistance by using the contact layer 904 made of gallium indium nitride having a smaller band gap than that of gallium nitride.

The invention is not limited to specific examples shown above. Although the structure shown in FIG. 10 has been explained as using gallium indium nitride as the material of the p-type cladding/contact layer 904, any other material containing indium and transparent to light emitted in the active layer 903 can be used, and will ensure substantially the same effects.

The p-type cladding/contact layer 904 may include two layers, a p-type cladding layer and a p-type contact layer. In this case, both the emission efficiency and the contact characteristics of electrodes can be improved.

The p-type cladding layer may include a plurality of layers different in mole fraction to gradually decrease the refractive index toward direction away from the active layer 903. In this case, light and carriers can be confined more efficiently.

The growth temperature of the p-type cladding/contact layer 904 need not fixed to 1000° C. shown above, and may be changed appropriately within the range not inviting thermal deterioration of the active layer 903.

The structure shown in FIG. 10 has been explained as being LED of a surface emission type. However, the invention is applicable also to semiconductor lasers using nitride compound semiconductors. Also in other various respects, the invention can be changed or modified within the spirit and scope of the invention.

What is claimed is:

1. A method for manufacturing a semiconductor light emitting element having a first layer of a first nitride compound semiconductor containing indium and a second layer stacked on said first layer, comprising the step of:

stacking said second layer under conditions on boundary lines of a closed region or inside the closed region defined by connecting points plotted at x and y coordinates (364, 600), (364, 1010), (550, 1010), and (650, 600) on a graph taking emission wavelengths based on band-to-band transition of said first layer in nanometer on the x axis and taking growth temperatures of said second layer in ° C. on the y axis.

2. The method according to claim 1 wherein said first layer and said second layer are stacked by metal-organic chemical vapor deposition, and said second layer is made of a second nitride compound semiconductor having a lower mole fraction of indium than said first layer, said method further comprising the step of stacking a third layer of a third nitride compound semiconductor having a lower mole fraction of indium than said first layer under conditions outside said closed region in said graph after said second layer is stacked.

3. The method according to claim 2 wherein said first layer is an active layer.

4. The method according to claim 2 wherein said first nitride compound semiconductor is gallium indium nitride, said second nitride compound semiconductor is gallium nitride, and said third nitride compound semiconductor is gallium nitride.

5. The method according to claim 2 wherein said second layer is stacked at the same temperature as that used for stacking said first layer.

6. The method according to claim 2 wherein said second layer has a thickness not less than 1 nm and not more than 100 nm.

7. The method according to claim 2 wherein said third layer is stacked by metal organic chemical vapor deposition.

8. The method according to claim 2 wherein said first nitride compound semiconductor is gallium indium nitride, said second nitride compound semiconductor is gallium aluminum nitride, and said third nitride compound semiconductor is gallium nitride.

9. The method according to claim 8 wherein said first layer and said second layer have thicknesses not exceeding critical thicknesses in terms of generation of crystallographic defects caused by lattice mismatching, said gallium indium nitride stacked as said first nitride compound semiconductor having a mole fraction within the miscibility gap thereof under an operation of a distortion energy by lattice mismatching.

10. The method according to claim 9 wherein said first nitride compound semiconductor has a mole fraction of indium not less than 0.2.

11. The method according to claim 10 wherein said first layer is an active layer.

12. The method according to claim 1, wherein:
said cladding layer stacked at a temperature higher than that used for stacking said active layer and not higher than 1010° C.

13. A method for manufacturing a semiconductor light emitting element configured to stack on a substrate an active layer of gallium indium nitride and to stack on said active layer a cladding layer of gallium indium nitride having a lower mole fraction of indium than said active layer, comprising:
said cladding layer being stacked at a temperature higher than that used for stacking said active layer,
wherein said active layer is stacked at a higher stacking rate than that of said cladding layer.

14. The method according to claim 13 wherein said active layer and said cladding layer are stacked by metal-organic chemical vapor deposition.

15. The method according to claim 14 wherein said cladding layer contains an acceptor impurity and said cladding layer is stacked by using an inert gas as a carrier gas.

* * * * *